United States Patent
Hattori et al.

(10) Patent No.: US 6,748,034 B2
(45) Date of Patent: *Jun. 8, 2004

(54) VITERBI DECODING APPARATUS AND VITERBI DECODING METHOD

(75) Inventors: Masayuki Hattori, Kanagawa (JP); Toshiyuki Miyauchi, Tokyo (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,452

(22) Filed: Dec. 17, 1998

(65) Prior Publication Data
US 2003/0108128 A1 Jun. 12, 2003

(30) Foreign Application Priority Data
Dec. 19, 1997 (JP) .......................... P09-351434

(51) Int. Cl.$^7$ .............................. H04L 27/06
(52) U.S. Cl. ................. 375/341; 375/340; 375/262; 375/265; 714/795
(58) Field of Search .................. 375/340, 341, 375/262, 377, 265; 714/794, 795, 796

(56) References Cited

U.S. PATENT DOCUMENTS

| | | | | |
|---|---|---|---|---|
| 4,777,636 A | * | 10/1988 | Yamashita et al. | 714/795 |
| 5,878,060 A | * | 3/1999 | Wakamatsu | 714/795 |
| 5,878,098 A | * | 3/1999 | Wang et al. | 375/377 |
| 5,970,097 A | * | 10/1999 | Ishikawa et al. | 375/262 |
| 6,301,314 B1 | * | 10/2001 | Murayama | 375/341 |
| 6,301,684 B1 | * | 10/2001 | Watanabe et al. | 714/796 |

* cited by examiner

Primary Examiner—Shuwang Liu
(74) Attorney, Agent, or Firm—Sonnenschein, Nath & Rosenthal

(57) ABSTRACT

A register train is provided in addition to a train of memory cells as many as a cut length which are arranged in correspondence to each state. Outputs of selectors at respective stages in the register train corresponding to state 00 are inputted to a register (1021) in the register train and selectors. Outputs of the registers at the front stages are inputted to those three selectors, respectively. The three selectors switch outputs to the post stages in accordance with a control by a control circuit when a reception word is terminated and in the other cases. Thus, when the reception word is terminated, information stored in the register train is transferred as it is. By such an operation, a path which reaches state 00 can be decoded when a reception word is terminated.

17 Claims, 17 Drawing Sheets

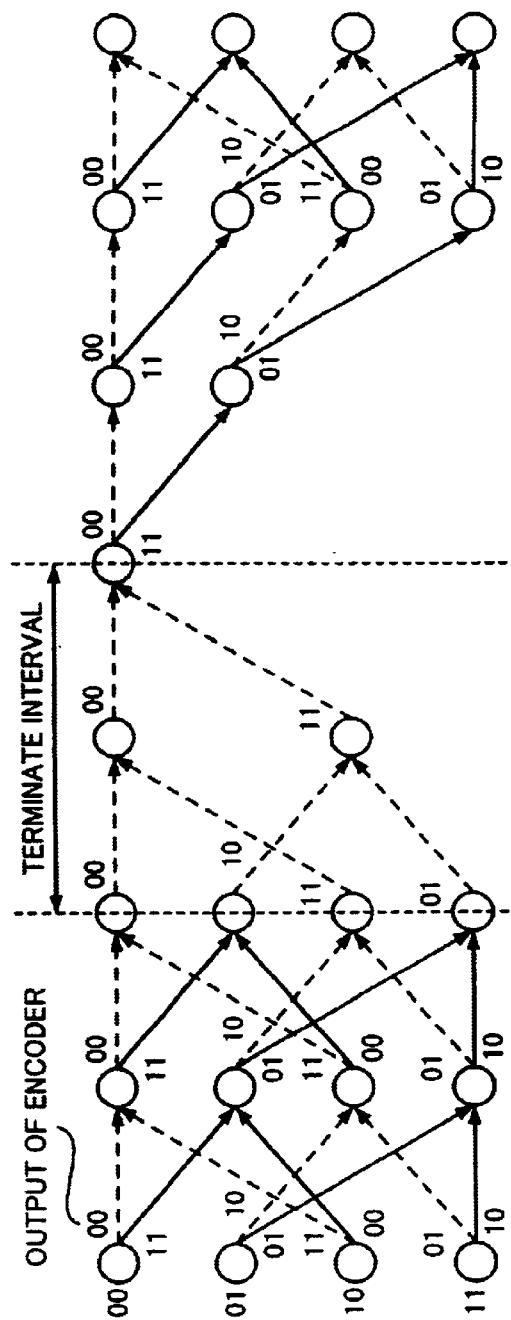
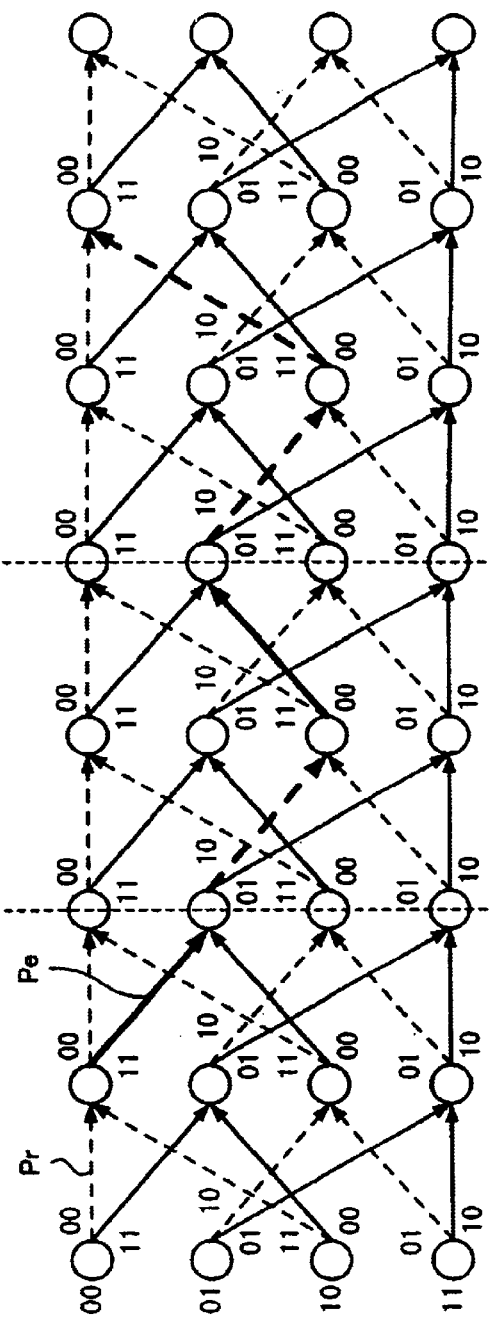
Fig. 8A
Fig. 8B
Prior Art

VITERBI DECODING APPARATUS AND VITERBI DECODING METHOD

BACKGROUND OF THE INVENTION

1. Field of the Invention

The invention relates to a Viterbi decoding apparatus and a Viterbi decoding method which is used for a maximum likelihood decoding method of a convolution code that is used for, for example, a satellite broadcasting or the like.

2. Description of the Related Art

As one of methods of decoding the convolution code, a Viterbi decoding method is known. The Viterbi decoding method is a maximum likelihood decoding method for the convolution code, whereby an error correction is executed by selecting a series (hereinafter, such a series is referred to as a maximum likelihood path) which is the nearest to a received code series from code series which can be formed from an encoder on a transmission side. That is, a transition diagram (hereinbelow, referred to as a trellis) which is formed on the basis of an encoding method by the encoder on the transmission side is used as a prerequisite. For example, a transition in which a hamming distance from the received code series is the shortest is selected from transitions as a maximum likelihood path which can occur on the transition diagram.

A Viterbi decoding apparatus for executing the Viterbi decoding method comprises: a branch metric calculating circuit for calculating a branch metric, namely, a hamming distance between a path which reaches each state on the trellis and the received code series in response to a clock; an ACS circuit for calculating a state metric on the basis of the branch metric, comparing values of the state metrics, and selecting a maximum likelihood path; a normalizing circuit for normalizing the value of the state metric; a state metric storing circuit for storing the value of the state metric; and a path memory circuit for forming decoding data in accordance with a selection result by the ACS.

In this instance, as a path memory circuit, there are two kinds of circuits of a circuit for executing a register transition method of transferring path selection contents by using a register train and a circuit for executing a method of storing the path selection contents by using an RAM and tracing the storage contents, thereby decoding. Those two kinds of methods will now be described hereinbelow.

In the register transition method which has been used in the general Viterbi decoding apparatus, memory cells each comprising a selector and a register are arranged on the trellis in the path memory circuit and the contents in the register are transferred on the basis of path selection information which is outputted from the ACS circuit. By selecting an output of a maximum likelihood state among outputs of memory cells at the final stage, information for the maximum likelihood path is selected and decoding data is outputted.

Although such a register transition method has an advantage such that a high speed operation can be executed, there is a drawback such that when a cut length increases, a circuit scale becomes very large. Particularly, since an application such that the cut length exceeds 100 has recently been presented, the increase in circuit scale becomes a serious problem.

In recent years, a method of decoding by storing path information by using an RAM (Random Access Memory) and tracing the stored information has been being actively studied. Such a method will now be called a trace-back method hereinlater.

As a method of terminating the encoding of the convolution code, a termination has been known. When the terminated convolution code is Viterbi decoded, the maximum likelihood path can be obtained by decoding by tracing back a path from a state of all 0. In the Viterbi decoding apparatus which has been used so far, when the terminated convolution code is successively received, the decoding is executed by the normal operation in many cases.

In such a decoding method, there is a problem such that when the next convolution code is continuously inputted subsequently to the terminated convolution code, a strict maximum likelihood decoding cannot be executed, so that there is a fear that a decoding error occurs. Since this problem is caused by a point that a termination interval is not considered when the Viterbi decoding is performed, the problem also occurs in both of the above-mentioned register transition method and the trace-back method.

The invention is proposed in consideration of such a circumstance. It is, therefore, an object of the invention to provide a Viterbi decoding apparatus and a Viterbi decoding method which can execute a strict maximum likelihood decoding even for a terminated convolution code.

SUMMARY OF THE INVENTION

Methods and systems consistent with the present invention provide a Viterbi decoding apparatus for continuously receiving a terminated convolution code, comprising terminate state path decoding means for certainly decoding a path which reaches a state to be terminated.

Methods and systems consistent with the present invention also provide a Viterbi decoding method for continuously receiving a terminated convolution code, comprising terminate state path decoding step of certainly decoding a path which reaches a state to be terminated.

According to the invention as mentioned above, since the path which reaches the state to be terminated can be certainly decoded, it is possible to execute a maximum likelihood decoding for the terminated convolution code.

The above, and other, objects, features and advantage of the present invention will become readily apparent from the following detailed description thereof which is to be read in connection with the accompanying drawings.

BRIEF DESCRIPTION OF THE DRAWINGS

FIGS. 8A and 8B are schematic diagrams for explaining a trellis at the time of the termination and a decoding error in a Viterbi decoding apparatus which has conventionally been used;

DETAILED DESCRIPTION OF THE PREFERRED EMBODIMENTS

Figure 1:
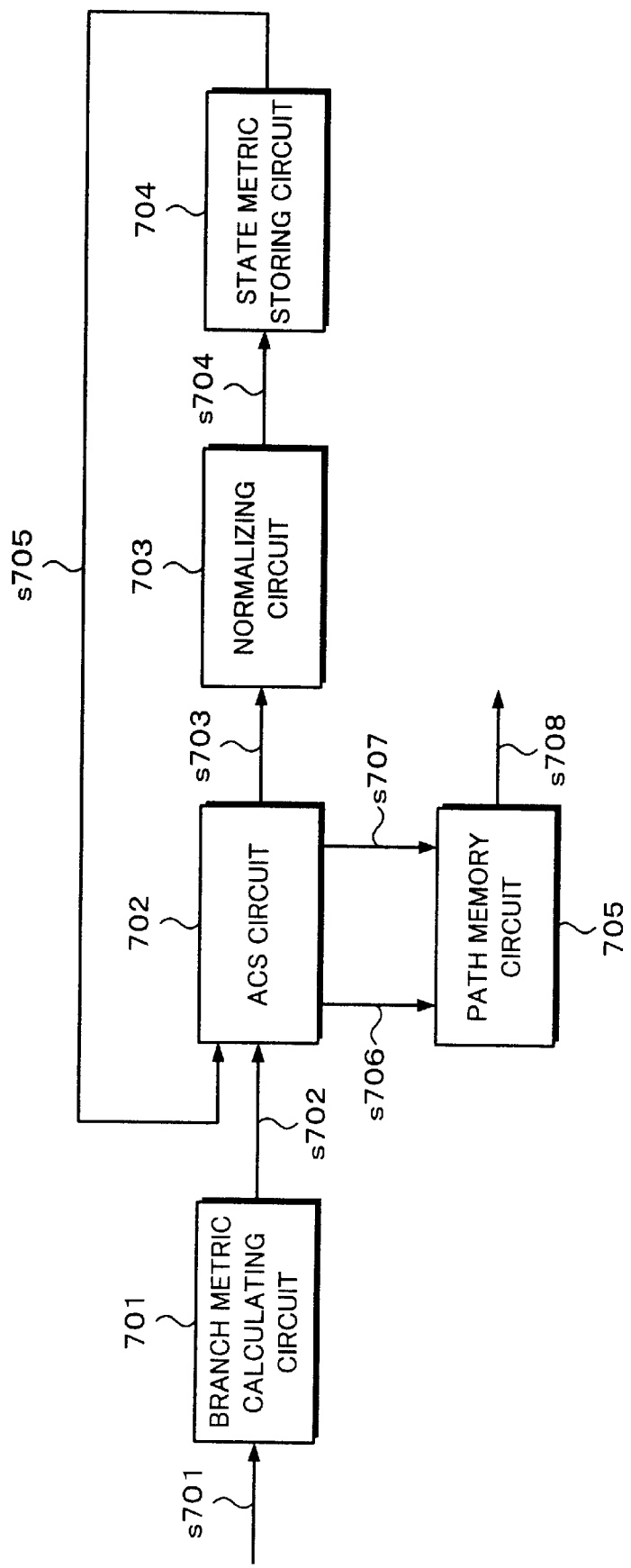
FIG. 1 is a block diagram for explaining a whole construction of an embodiment of the invention.

The first embodiment of the invention will now be described hereinbelow with reference to the drawings. First, a whole construction of the first embodiment of the invention will now be explained with reference to FIG. 1. The first embodiment of the invention comprises: a branch metric calculating circuit 701; an ACS circuit 702; a normalizing circuit 703; a state metric storing circuit 704; and a path memory circuit 705. When data received from a transmission side through a transmission path is inputted, a maximum likelihood path is selected from a code series which can be formed from an encoder on the transmission side and decoding data is formed on the basis of selection contents.

Figure 2:
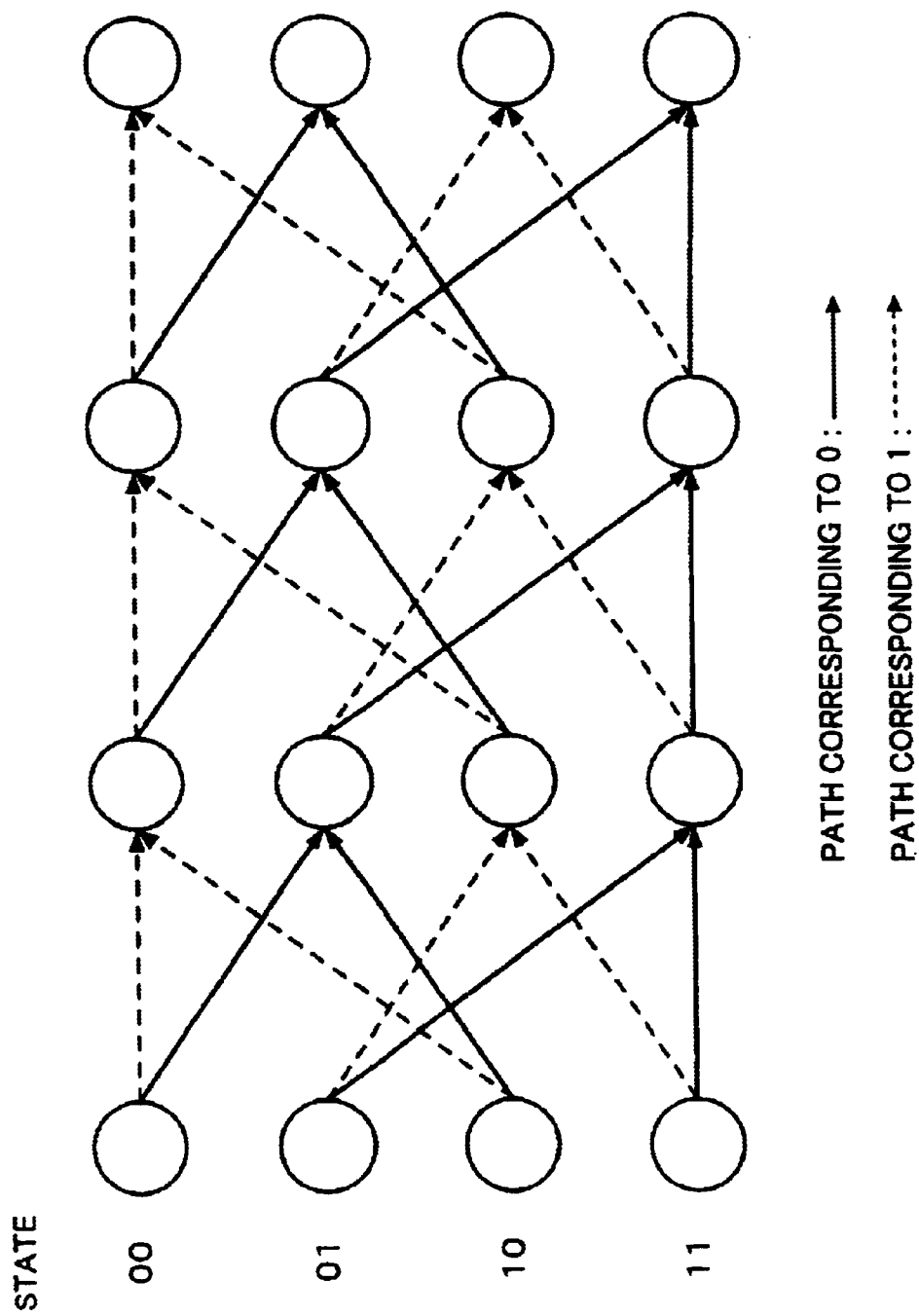
FIG. 2 is a block diagram for explaining a transition diagram when the restriction length=3.

That is, for example, a transition diagram (hereinbelow, referred to as a trellis) as shown in FIG. 2 which is formed on the basis of an encoding method by the encoder on the transmission side is used as a prerequisite and, for example, a path whose hamming distance from a received code series is the shortest is selected as a maximum likelihood path from the transitions which can occur on the transition diagram.

When a reception data signal s701 is inputted, the branch metric calculating circuit 701 calculates a branch metric of the reception data and outputs a calculation result as a branch metric signal s702. On the basis of the branch metric signal s702 and a state metric signal s705 which is inputted from the state metric storing circuit 704, the ACS circuit 702 adds the branch metric and the state metric to each of two paths which join to a certain state, compares those addition values, selects the addition value having a higher likelihood on the basis of a comparison result, and sets it as a new state metric.

Such selected contents are outputted as path selection information s706, the number of a state having the minimum state metric is outputted as a maximum likelihood state signal s707, and a newly obtained state metric is outputted as a new state metric signal s703.

A method of selecting the path will now be described with respect to a case where a restriction length=3. A trellis of FIG. 2 has four states 00, 01, 10, and 11 and indicates an example of the trellis in the case where the restriction length=3. An arrow indicates a path which can occur every time slot. A path corresponding to decoding data '0' is shown by a broken line. A path corresponding to decoding data '1' is shown by a solid line. Two paths which join exist in each of all states every time slot. A hamming distance (branch metric) between the reception signal and the path and an accumulation sum (state metric) of the branch metrics so far are added to each of the two paths which join to a certain state, addition results are compared, and the value having a higher likelihood is selected on the basis of a comparison result.

Figure 3:
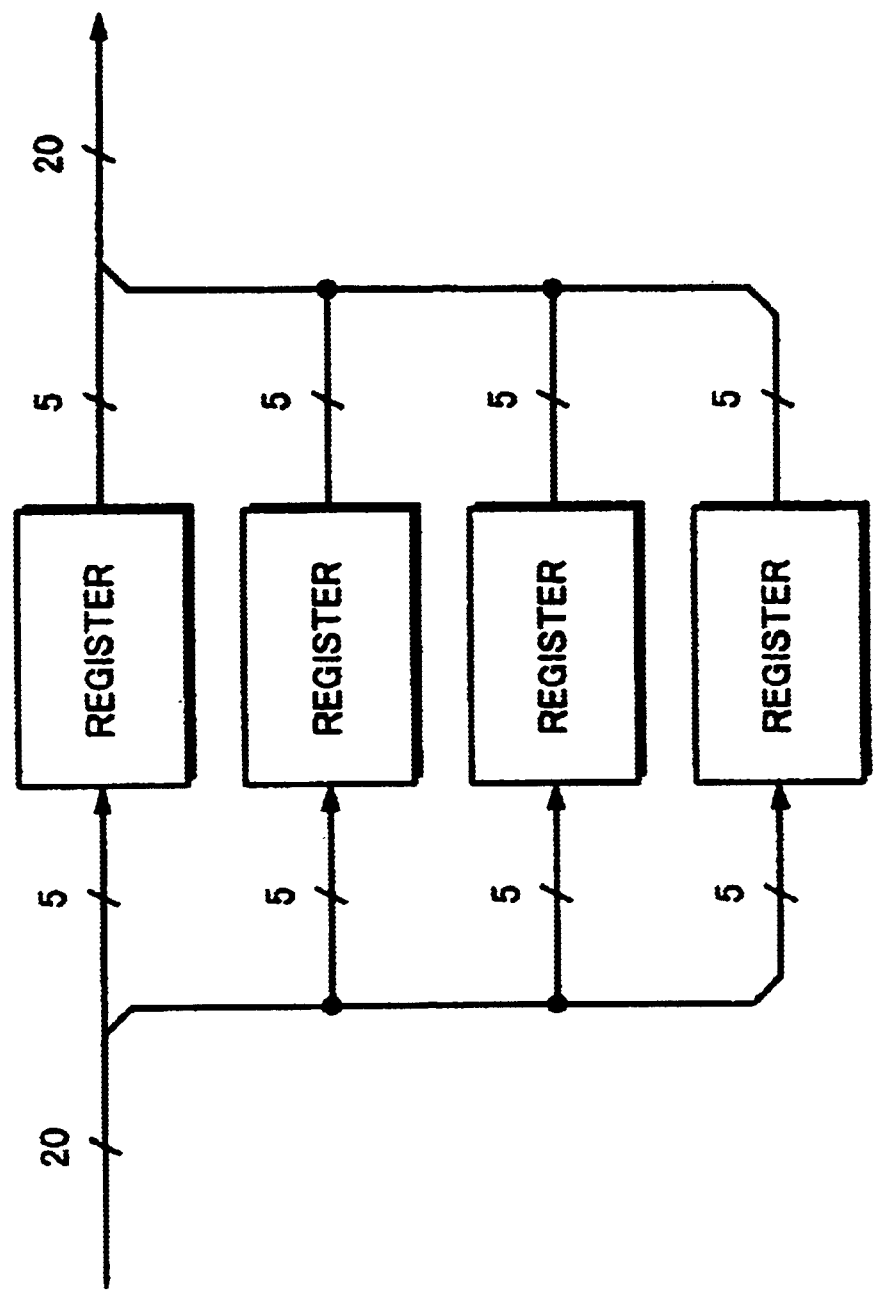
FIG. 3 is a block diagram depicting a conventional of the state metric storing circuit shown in FIG. 1.

The normalizing circuit 703 normalizes by using a method of subtracting the minimum state metric from the new state metric signal s703 which is outputted from the ACS circuit 702 or the like, sets a normalized value to a value within a preset range, and outputs it as a normalization state metric signal s704. The state metric storing circuit 704 stores the normalization state metric signal s704 which is outputted from the normalizing circuit 703 and returns it as a state metric signal s705 to the ACS circuit 702. An example of a construction of the state metric storing circuit 704 is shown in FIG. 3. It is assumed that the storing circuit 704 has four registers in correspondence to the four states in the trellis of FIG. 2. Although each of the four registers is a register of five bits in FIG. 3, a register of the other number of bits can be also used.

Figure 4:
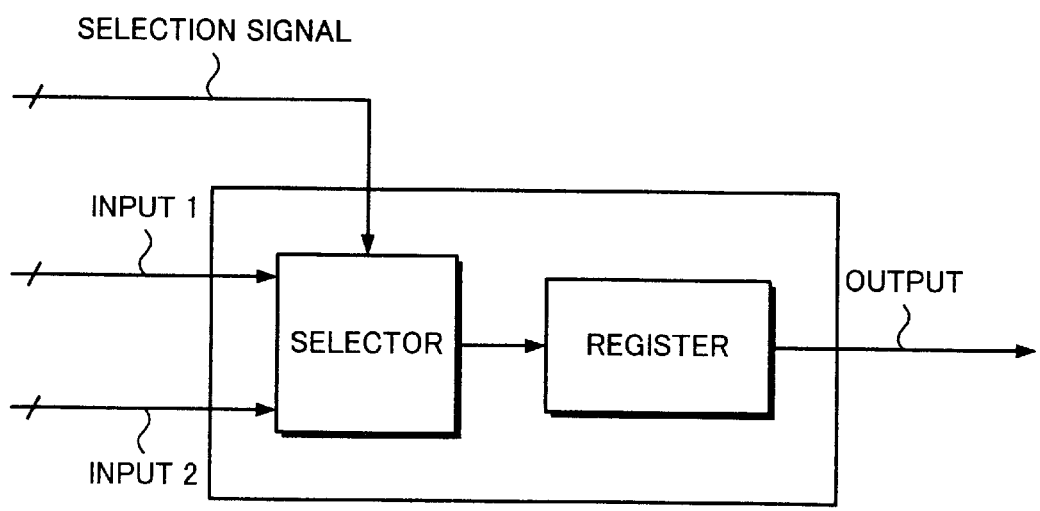
FIG. 4 is a schematic diagram for explaining a memory cell of a path memory in a register transition method.
Figure 5:
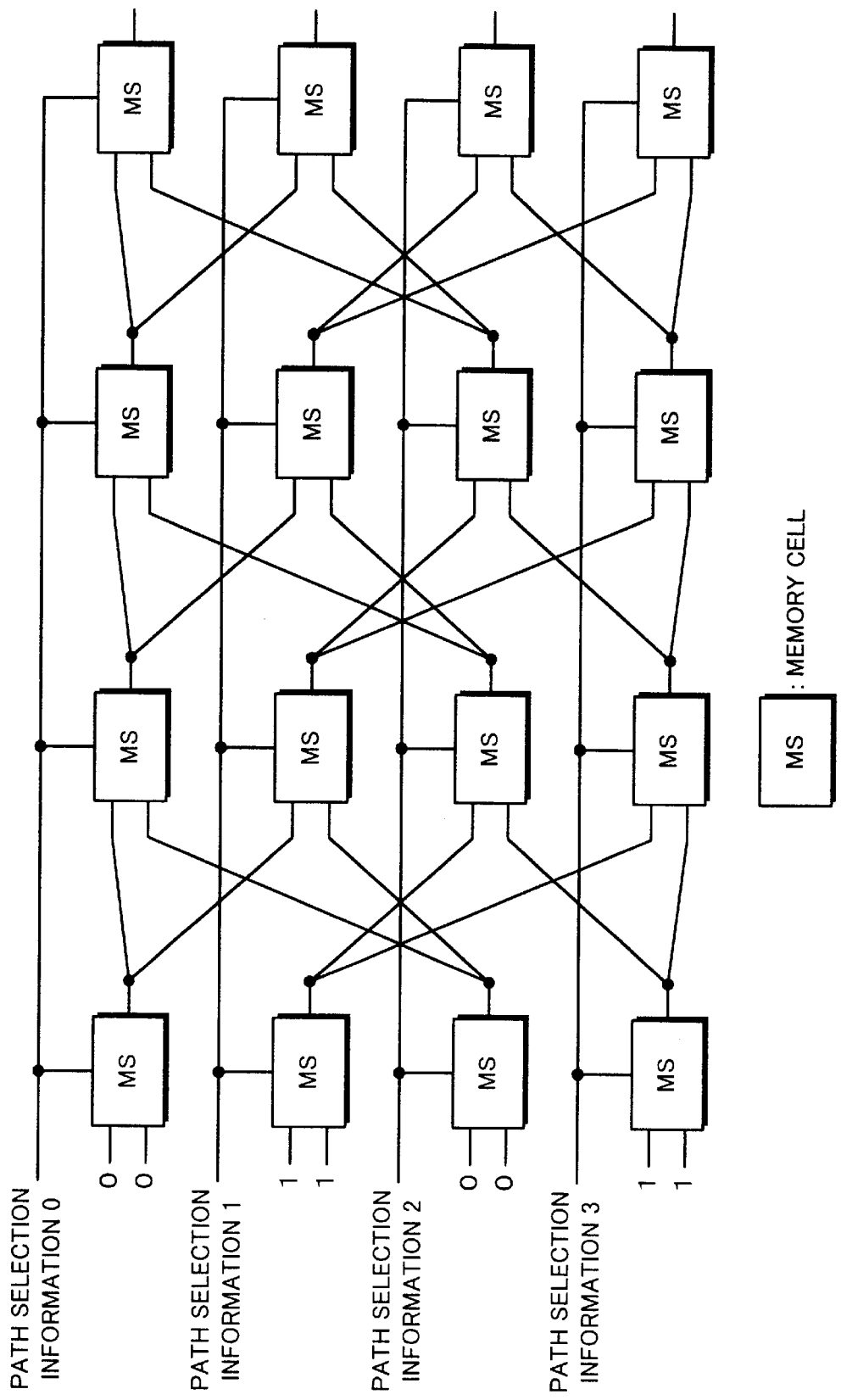
FIG. 5 is a schematic diagram for explaining an arrangement of memory cells in the path memory in the register transition method.

Subsequently, prior to explaining the path memory circuit 705 in the first embodiment of the invention, to make an understanding easy, a construction of a general path memory circuit to realize the register transition method will now be described. FIG. 5 shows a construction of a path memory circuit in which the memory cells each comprising the selector and register as shown in FIG. 4 are arranged in the trellis shown in FIG. 2. In FIG. 5, the memory cell is shown by MS. In the above construction, by transferring the contents of the register on the basis of the path selection information which is outputted from the ACS circuit 702, information corresponding to a survival path from each state is preserved in the register of each memory cell. Therefore, a decoding in which the trellis shown in FIG. 2 is used as a prerequisite, namely, a decoding by the register transition method in the case where there are four states and the restriction length=3 and the cut-length=4 is realized.

Figure 6:
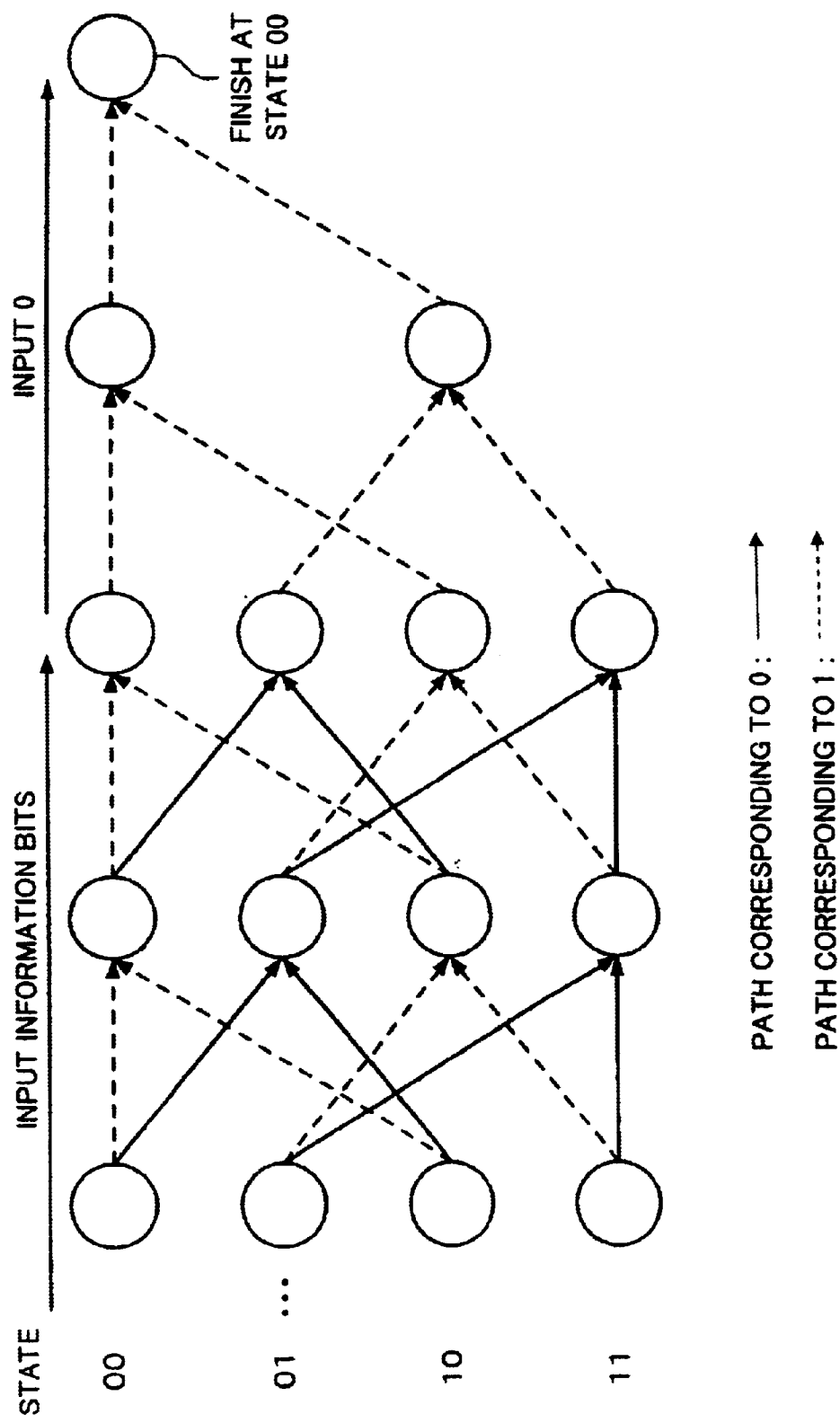
FIG. 6 is a schematic diagram for explaining a termination.

In such a general path memory circuit, there is a problem such that a strict maximum likelihood decoding cannot be performed when the terminated convolution codes are continuously received. This problem will now be described hereinbelow. A method of inputting 0 of the number (restriction length-1) to the encoder after all of the information bits were inputted in order to terminate the encoding of the convolution codes is known (refer to FIG. 6). The process to set the state of the encoder to all 0 at a predetermined time point as mentioned above is called "terminate". The number of times until the end of the termination after the start of the encoding is called "termination length".

In case of Viterbi decoding the terminated convolution code, by decoding by tracing back the path from the state of all 0, the maximum likelihood path can be obtained. In the actual Viterbi decoding apparatus, however, in case of continuously receiving the terminated convolution codes, the decoding is often performed by an ordinary operation.

Figure 7:
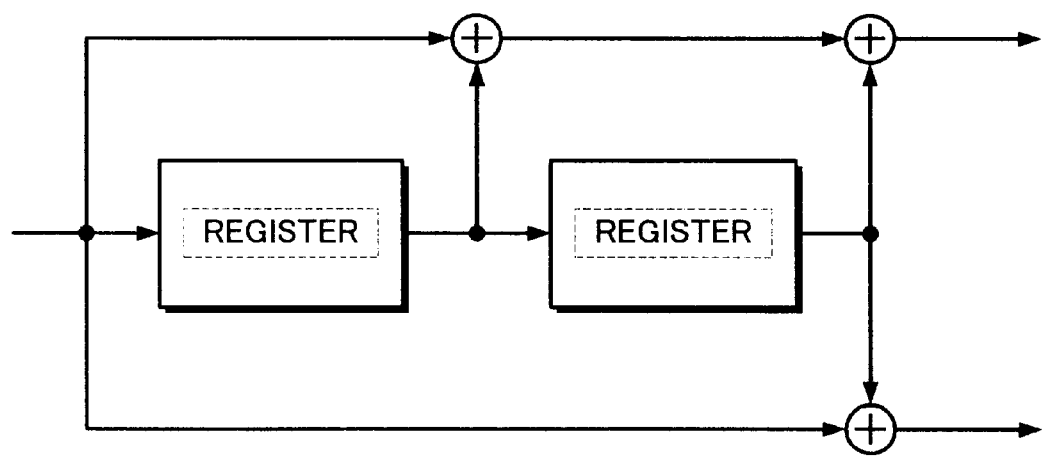
FIG. 7 is a schematic diagram showing an example of a convolution encoder of a restriction length=3.

In such a decoding method, however, when the next convolution code is continuously inputted subsequently to the terminated convolution code, there is a case where the strict maximum likelihood decoding cannot be performed. Such a case will now be described hereinbelow. In case of using a convolution encoder of the restriction length=3 as shown in FIG. 7, a case where the next encoding is subsequently executed after the code was terminated will now be considered. An example of the trellis in this case is shown in FIG. 8A. FIG. 8A shows a trellis which is traced in the case where the code subsequent to the terminating interval is decoded by tracing back the path from the state of all 0, thereby obtaining the maximum likelihood path.

A case where a correct path is a path (Pr in FIG. 8B) of all 0 will now be considered. In this case, if the decoding is performed without considering the termination, there is a fear such that an error path Pe as shown in FIG. 8B is decoded. This is because as for the error path Pe, since a Hamming distance from the path Pr of all 0 is small to be 6, a probability such that it is erroneously set to a decoding result is relatively high.

Now, assuming that the error path Pe was erroneously decoded, even if the decoding bits in an interval where the termination is executed are ignored, an error of one bit is included in the information bits regarding the transmission information. Since this path does not exist on the inherent terminated trellis, if the strict maximum likelihood decoding is performed in consideration of the terminating interval, such a decoding error does not occur.

Figure 9:
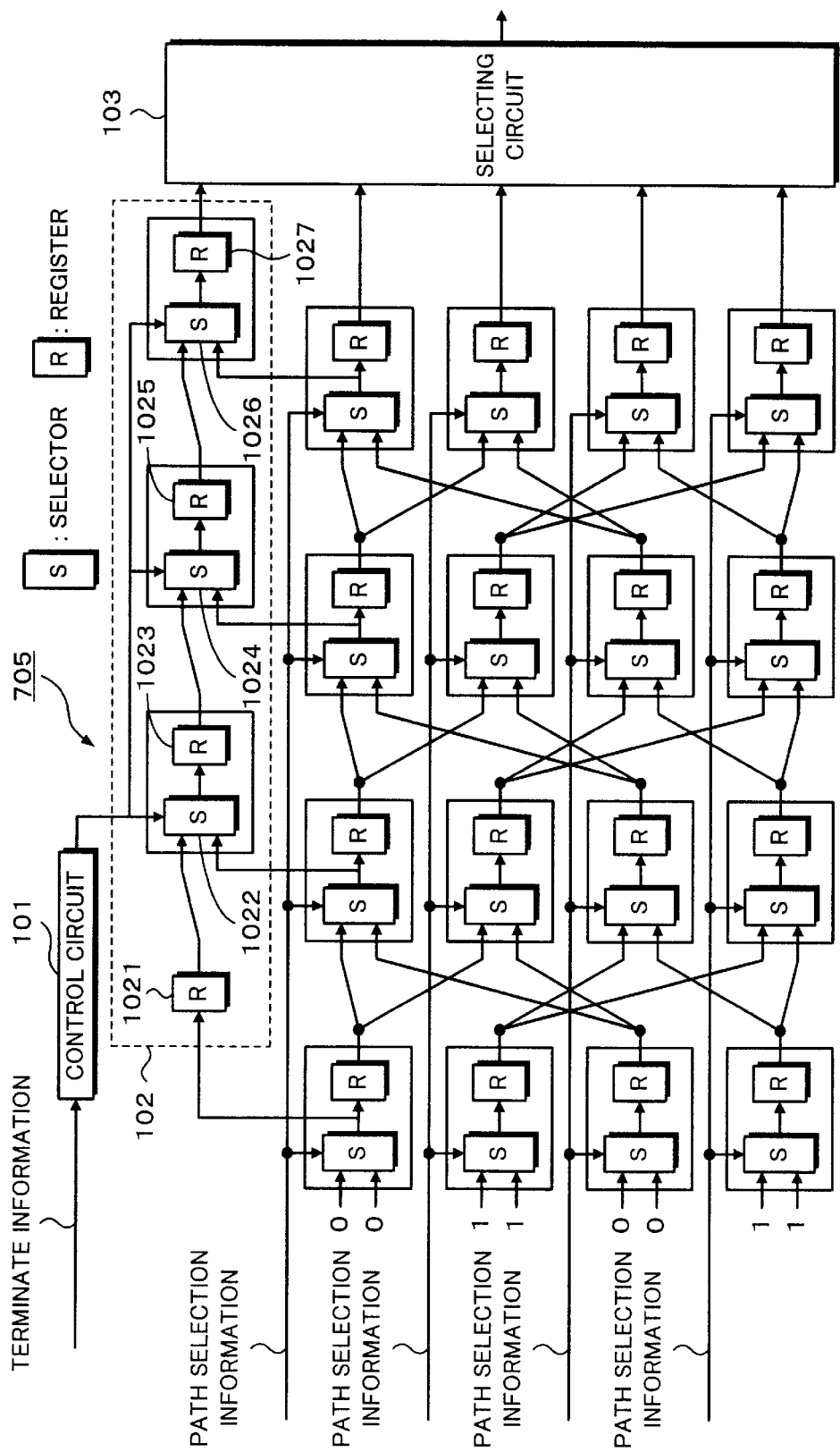
FIG. 9 is a block diagram for explaining a path memory circuit in the first embodiment of the invention.

FIG. 9 shows a construction of the path memory circuit 705 in the first embodiment of the invention in which the strict maximum likelihood decoding is performed in consideration of the terminating interval from a viewpoint of the above circumstances. In addition to a train of the memory cells as many as the cut length arranged in correspondence to each state, the path memory circuit 705 has a register train 102 and a control circuit 101 controls the register train 102 on the basis of the termination information.

That is, outputs of selectors at the first stage, second stage, third stage, and fourth stage in the register train corresponding to state 00 are inputted to a register 1021 and selectors 1022, 1024, and 1026 in the register train 102, respectively. Outputs of registers 1021, 1023, and 1025 at the front stages are inputted to the selectors 1022, 1024, and 1026, respectively. Each of the selectors 1022, 1024, and 1026 outputs one of the data which is inputted to the register at the post stage in response to a command of the control circuit 101.

Information corresponding to the survival path of each state is stored into the register by transferring in accordance with the path selection information of each state which is inputted from the ACS circuit 702. In an interval until the reception word is terminated, by selecting the output of the maximum likelihood state among the outputs at the final stages, the information corresponding to the maximum likelihood path is selected and the decoding data is outputted. In this interval, for example, '1' is outputted from the control circuit to the register train 102 and a decoding word corresponding to state 0 is also stored in the register train 102.

On the other hand, when the reception word is terminated, the signal from the control circuit 101 to the register train 102 is switched to, for instance, '0', thereby allowing the information stored in the register train 102 to be transferred as it is. By a selecting circuit 103 at the final stage, the output of the register train 102 is outputted as it is as a decoding word. By such an operation, the path which reaches state 00 can be decoded when the reception word is terminated.

For an interval when the contents of the register 102 are outputted, each of the other four register trains newly starts the ordinary transition corresponding to the subsequent convolution code, returns the operation to the ordinary decoding operation simultaneously with that all of the contents of the register train 102 are outputted, and switches the signal from the control circuit 101 to '0'. In the first embodiment of the invention as mentioned above, even in the case where the terminated convolution codes are continuously inputted, the path which reaches the state to be terminated can be decoded while continuing the decoding operation. Thus, the terminated code can be also strictly maximum likelihood decoded and a decoding error rate can be improved.

Figure 10:
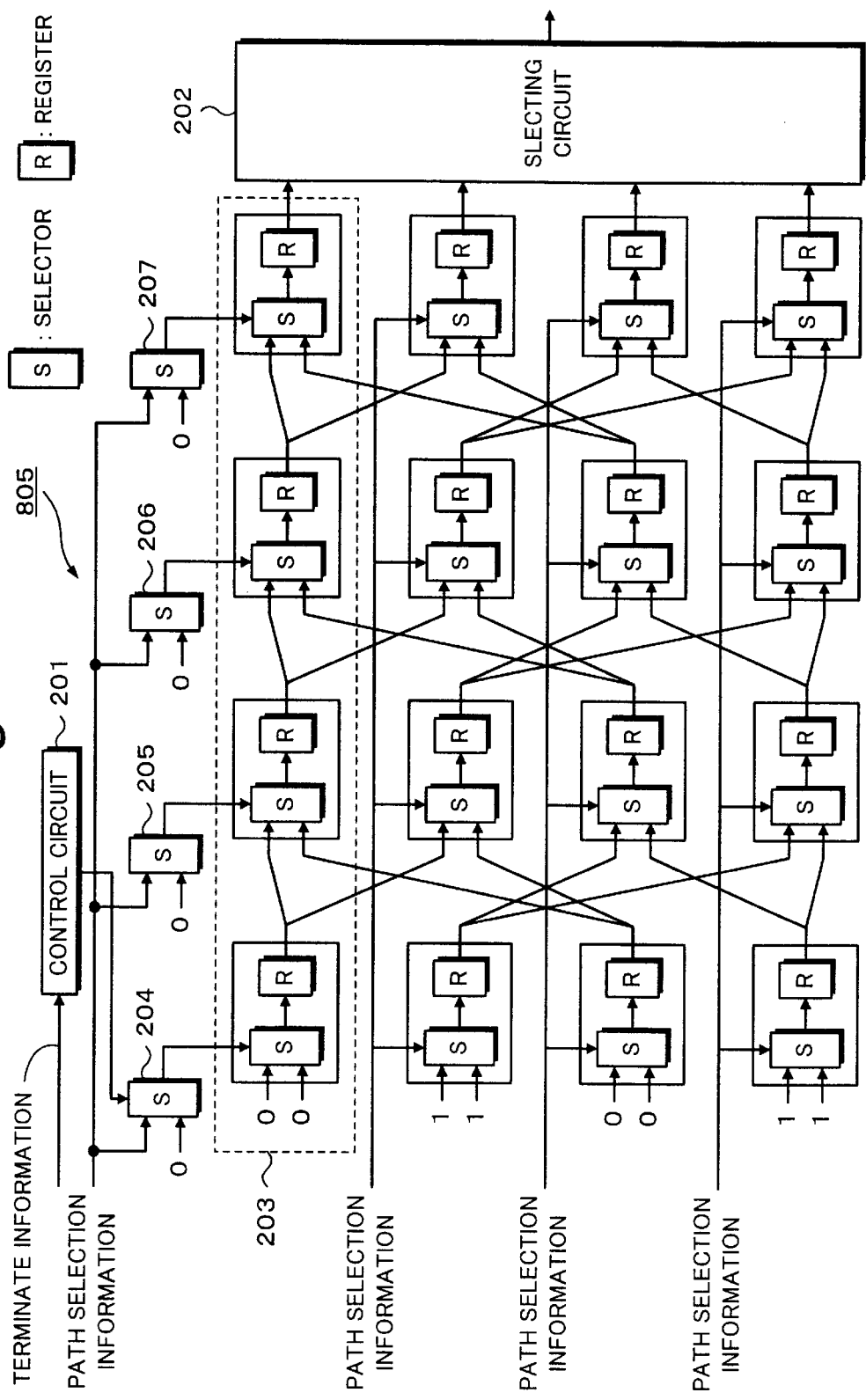
FIG. 10 is a block diagram for explaining a path memory circuit in the second embodiment of the invention.

The second embodiment of the invention using a path memory circuit 805 having a construction different from the first embodiment of the invention will now be described. FIG. 10 shows the construction of the path memory circuit 805 in the second embodiment of the invention. When performing the decoding of the restriction length-3 and the cut-length=4, the path strict maximum likelihood decoding even for the terminated reception word.

In the path memory circuit 805, in the train of the memory cells as many as the cut length arranged in correspondence to each state, the signal which is inputted to a selector of each memory cell in a register train 203 corresponding to state 00 is controlled by a control circuit. That is, selectors 204, 205, 206, and 207 are provided and the path selection information and '0' are inputted to those selectors. In response to a command from a control circuit 201, each of the selectors 204 to 207 inputs one of the path selection information and '0' as a control signal to the selector of each memory cell in the register train 203.

The following operation is realized by such a construction. That is, for an interval until the reception word is terminated, the path selection information is given as a control signal to the register train 203 of state 00 and the ordinary register transition is performed. Among the outputs at the final stages, by selecting the output of the maximum likelihood state, information corresponding to the maximum likelihood path is selected and the decoding data is outputted. On the other hand, at the clock, when the reception word is terminated, it is controlled so that the selectors 204 to 207 give '0' as control signals for the resister train 203 of state 00. The storage contents at this clock are transferred as they are.

In the next clock, the selector 204 gives the path selection information to the selector of the memory cell at the first stage and the selectors 205 to 207 give '0' to the selectors of the memory cells at the second and subsequent stages. Further in the next clock, the selectors 204 and 205 give the path selection information to the selectors of the memory cells up to the second stage. The selectors 206 and 207 give '0' to the selectors of the memory cells at the third and subsequent stages. In a manner similar to the above, the control signals are sequentially switched by the number of signals corresponding to the cut length. Upon termination, until the output of the decoding words stored in the register train of state 00 is completed, a selecting circuit 202 at the final stage generates the output from state 00 as decoding data.

For a period of time until the output of the decoding words stored in the register train of state 00 is finished, the path memory executes the ordinary operation to the convolution code which is subsequently inputted. Therefore, simultaneously with the end of the decoding of the terminated code, the operation can be returned to the ordinary decoding.

As mentioned above, in the second embodiment of the invention as well, even when the terminated convolution codes are continuously inputted, the path which reaches the state to be terminated can be decoded while continuing the decoding operation.

The first and second embodiments of the invention mentioned above relate to the register transition method as a prerequisite. The decoding error which can occur in the case where the terminated convolution codes are continuously inputted also similarly becomes a problem in a Viterbi decoding apparatus for performing a decoding by the trace-back method. The third embodiment of the invention, therefore, to solve the problem in the trace-back method will now be described. For easy understanding, the general trace-back method which has been used hitherto will be first described.

Figure 11:
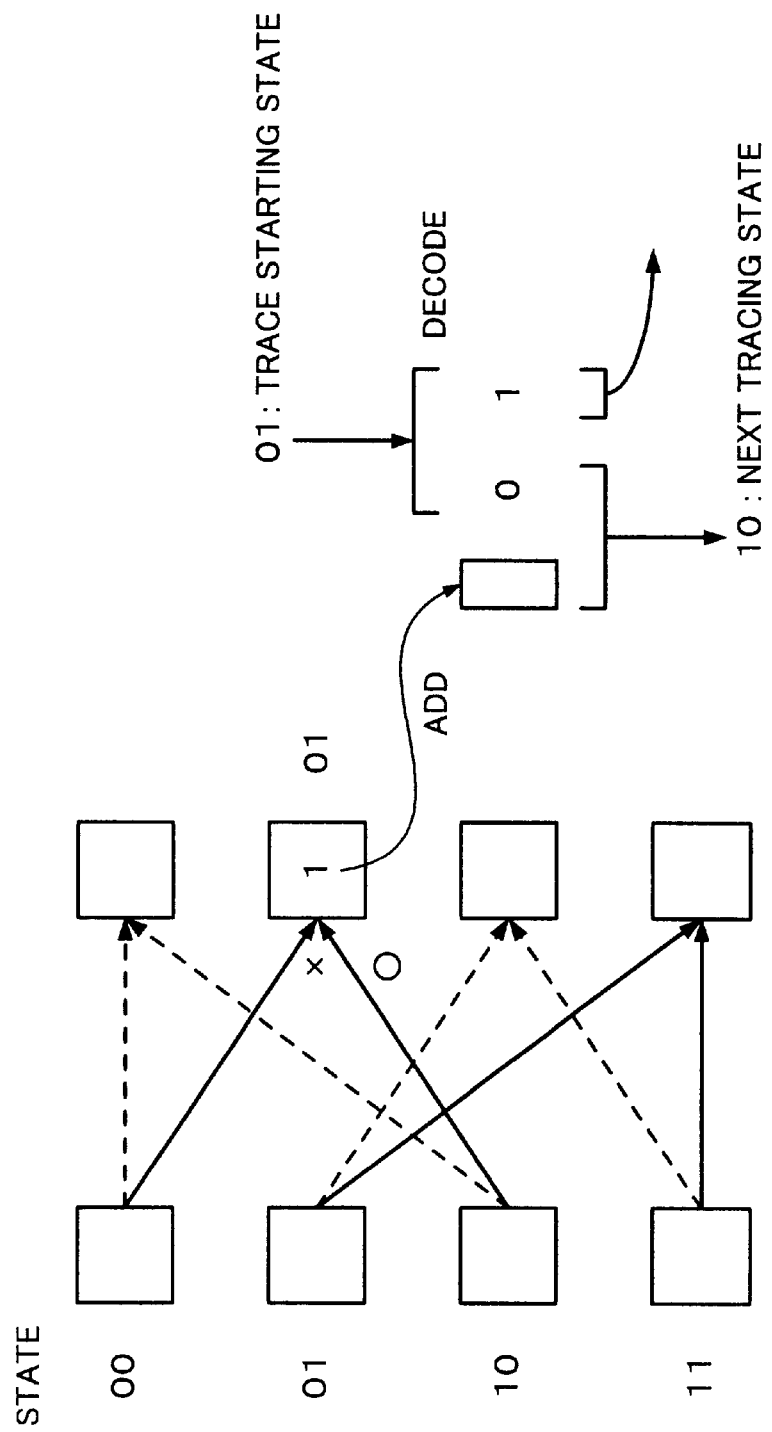
FIG. 11 is a schematic diagram for explaining a principle of the tracing in a trace-back method.

The principle operation of the trace in the trace-back method will now be described with respect to the case where the restriction length=3 as an example. In FIG. 11, a case of tracing from state 01 will be considered. States having a possibility of the transition to state 01 are state 00 and state 10. When the path on the state 00 side has been selected, 0 is stored in the path memory. When the path on the state 10 side is selected, 1 (namely, the most significant bit of the previous state) is stored in the path memory.

Figure 12:
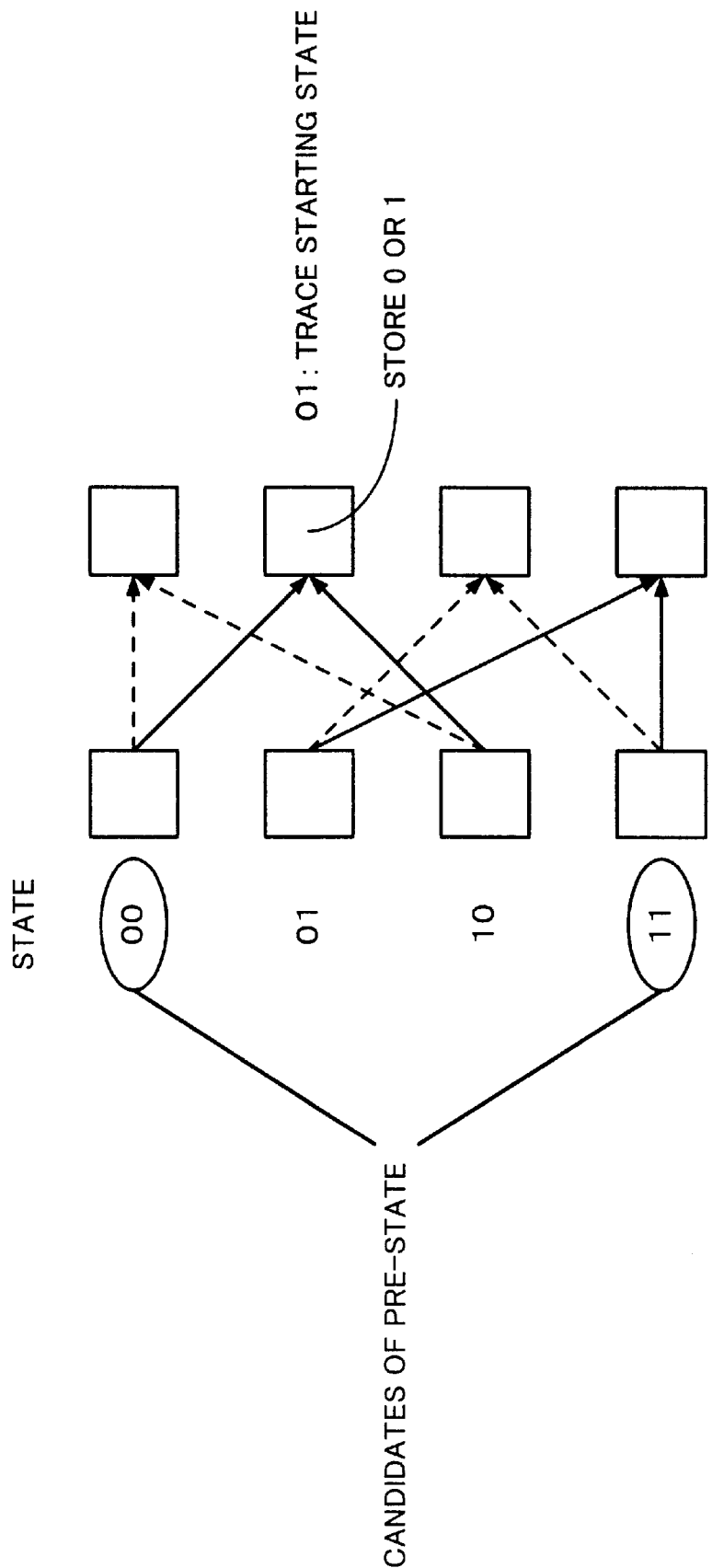
FIG. 12 is a schematic diagram for explaining a method of the tracing in the trace-back method.

Even in case of transferring from any state, the input is 1 and it is expressed by the least significant bit of state 01. From the above explanation, it is sufficient to execute the tracing operation as follows. As shown in FIG. 12, the least significant bit of trace starting state in which the tracing is started is set to the decoding bit. The number of the next tracing state which is traced subsequently to the trace starting state is formed by newly adding the bit in the path memory as a most significant bit to the bits from the most significant bit to the lower second bit of the trace starting state. By such an operation, the selected path can be traced from the state in which the minimum state metric is obtained.

To make the Viterbi decoding apparatus operative at a high speed, the RAM can be accessed only once every clock. Explanation will be made with respect to a case of using a path memory circuit having four memories of a single port in order to perform the decoding for each RAM by an access of one time. In the following description, the restriction length=3 of the code and the cut length=4 are used as a prerequisite. A path memory circuit which is used in this case is a path memory circuit having four RAMs of a single port having the bit number (in this example, four bits) as many as the number of states and the word number (in this example, four words) corresponding to the cut length.

Figure 13:
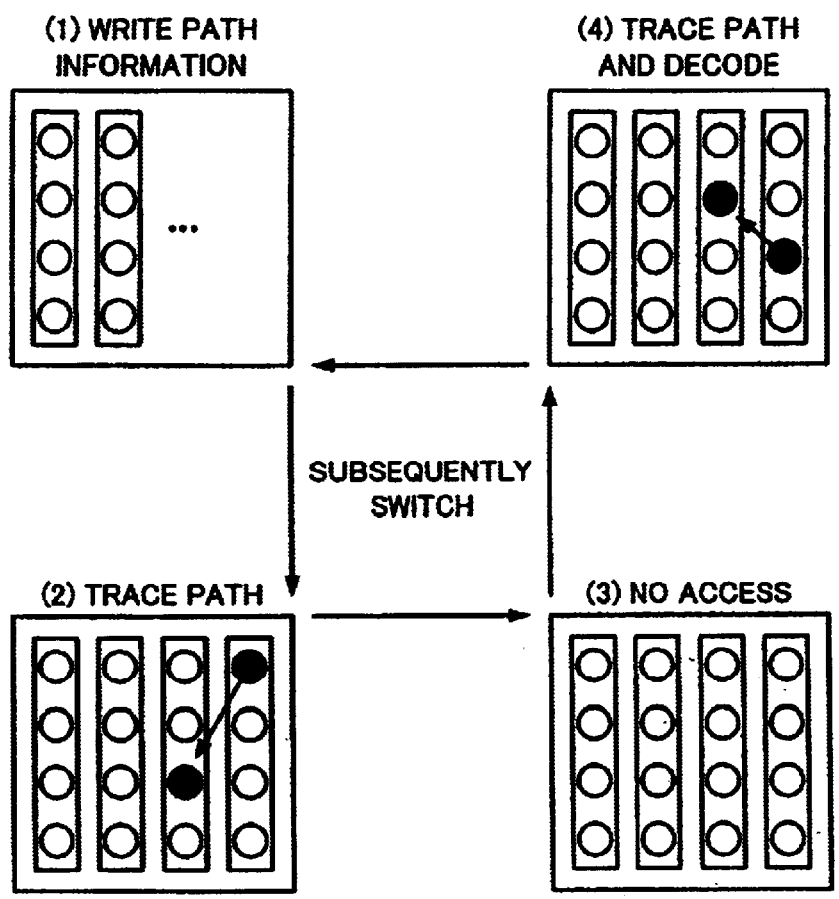
FIG. 13 is a schematic diagram depicting a role of each RAM in a conventional trace-back method in accordance with the present invention.
Figure 14:
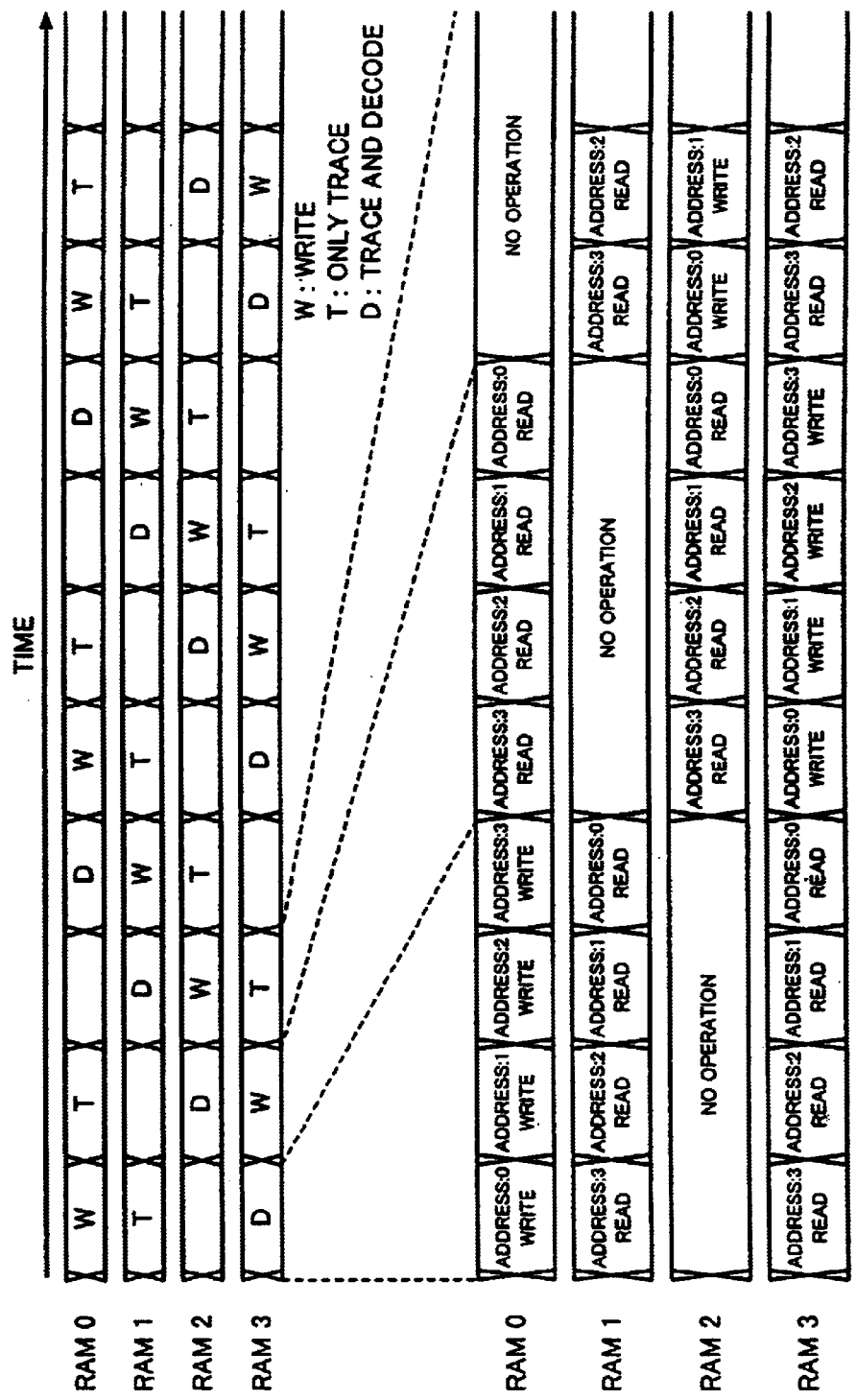
FIG. 14 is a schematic diagram depicting a memory operation in the conventional trace-back method in accordance with the present invention.

The path selection information as much as the number of states is inputted every clock from the ACS circuit 702 to the path memory circuit. As for the four RAMs, the following four roles (1) to (4) are sequentially switched every clocks (in this case, four clocks) corresponding to the cut length (refer to FIG. 13). An example of the operation of each of the four RAMs based on such an operation is shown in FIG. 14.

(1) The path selection information is sequentially written.
(2) The tracing is sequentially performed on the basis of the written path selection information. The decoding is not performed.
(3) No access
(4) The tracing is sequentially performed from the trace result in (2) and the decoding bits are outputted.

The decoding by the trace-back method is realized by the construction and operation of the path memory circuit.

Figure 15:
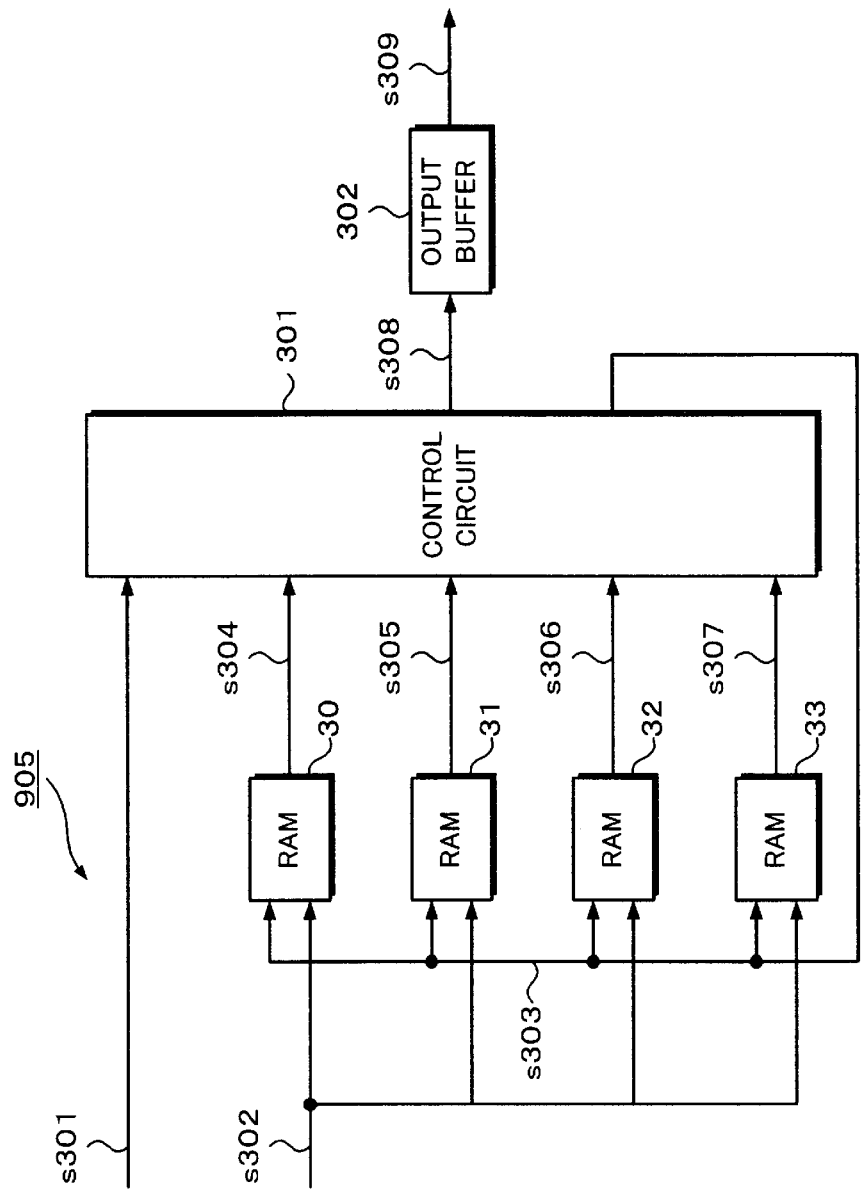
FIG. 15 is a block diagram for explaining a path memory circuit in the third embodiment of the invention.

In the Viterbi decoding apparatus for performing the trace-back method as mentioned above, the third embodiment of the invention to solve the foregoing problem regarding the termination of the convolution code will now be described. FIG. 15 shows a construction of a path memory circuit 905 in the third embodiment of the invention. The path memory circuit 905 is a path memory circuit for performing the decoding by the trace-back method by using four RAMs of a single port of four bits and four words in the case where the decoding in which (the cut-length)=(the termination length/4)=4 is performed to the code of the restriction length=3 and the termination length=16. It is now assumed that the start time point of writing the path selection information to the RAM is matched to the start time point of the encoding.

As for RAMs 30, 31, 32, and 33, the writing of path selection information s302 which is inputted from the ACS circuit and the reading of the stored path selection information are performed in response to a control signal s303 which is formed by a control circuit 301 and read path selection information s304, s305, s306, and s307 is inputted to the control circuit 301. In a manner similar to the conventional method, the operation of the memory until the reception word is terminated is executed by switching the following roles.

(1) The path selection information is sequentially written.
(2) The tracing is sequentially executed on the basis of the written path selection information. The decoding is not performed.
(3) No access
(4) The tracing is sequentially performed from the trace result in (2) and the decoding bits are outputted.

When the terminated interval is decoded, the RAM for performing the role of (4) starts the tracing from state 00 instead of the tracing result of (2) and the decoding is performed. Therefore, the control circuit 301 switches the operation of each RAM in accordance with a termination signal s301. Since the starting time point for encoding is matched with the starting time point for writing into the RAM and there is a relation such that the cut-length is equal to ¼ of the termination length, the timing to finish the termination coincides with the timing to start the tracing. Even during the decoding of the terminated interval, the tracing of the portion of (2) for decoding the next interval is executed. Therefore, simultaneously with that the end of the decoding of the terminated code, the operation can be returned to the ordinary decoding operation.

A signal s308 decoded by the tracing in (4) is inputted to an output buffer 302 and is rearranged in accordance with the order of the inherent time series. After that it is outputted as a decoding bit signal s309. As mentioned above, in the third embodiment of the invention as well, even when the terminated convolution codes are continuously inputted, the path which reaches the state to be terminated can be decoded while continuing the decoding operation.

Figure 16:
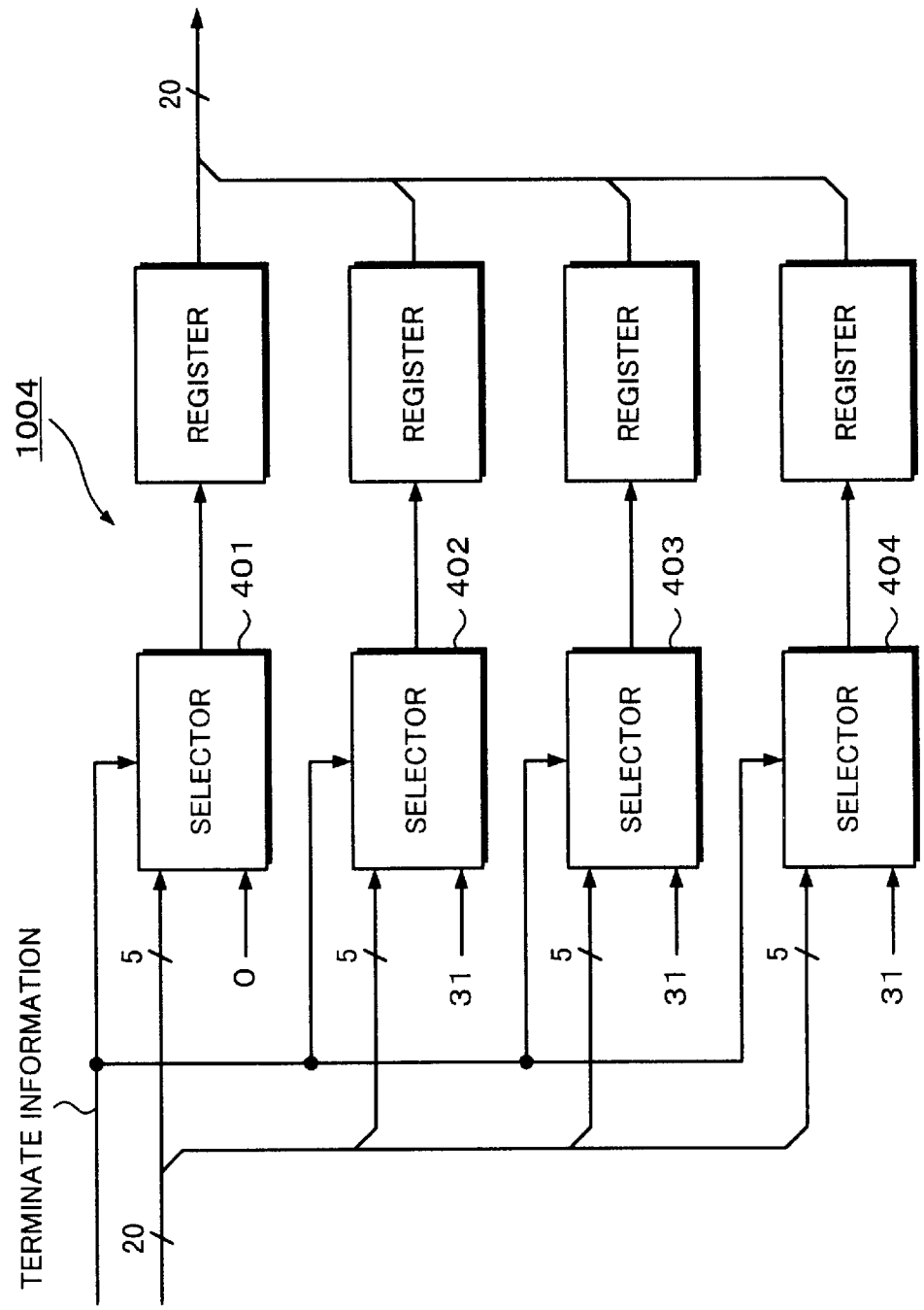
FIG. 16 is a block diagram for explaining a path memory circuit in the fourth embodiment of the invention.

The foregoing first, second, and third embodiments of the invention intend to solve the problem regarding the termination in the path memory circuit. On the other hand, the fourth embodiment of the invention which can solve the problem regarding the termination in the state metric storing circuit will now be described hereinbelow. A whole construction of the fourth embodiment of the invention is similar to those of the first embodiment and the like of the invention mentioned above. A construction of a state metric storing circuit 1004 in the fourth embodiment of the invention is shown in FIG. 16. The state metric storing circuit 1004 is a storing circuit of a state metric in the case where when a code of a restriction length=3 is decoded, a branch metric of 4 bits and a state metric of 5 bits are set.

Selectors 401, 402, 403, and 404 are provided at the front stage of four registers for storing state metrics of the paths which reach states 00, 01, 10, and 11. A value of the normalized state metric is inputted from the normalizing circuit to each selector. A value 0 is further inputted to the register 401 corresponding to state 00. A value 31 (the maximum value which is expressed by 5 bits) is further inputted to the selectors 402 to 404 corresponding to the other states. Termination information is inputted to the selectors 401 to 404 and each selector outputs the state metric and one of the values 0 and 31 on the basis of the termination information. A clipping is performed at the value 31 so that the state metric does not overflow in the ACS circuit 702.

In the state metric storing circuit 1004, the selectors 401 to 404 output the values of the state metrics to registers at the post stages, respectively, for a period of time until the reception word is terminated. Thus, the ordinary decoding such that the state metrics are sequentially updated and the decoding data before the cut-length is outputted is performed. On the other hand, when the reception word is terminated, each selector outputs a value other than the value of the state metric to each register at the post stage.

Figure 17:
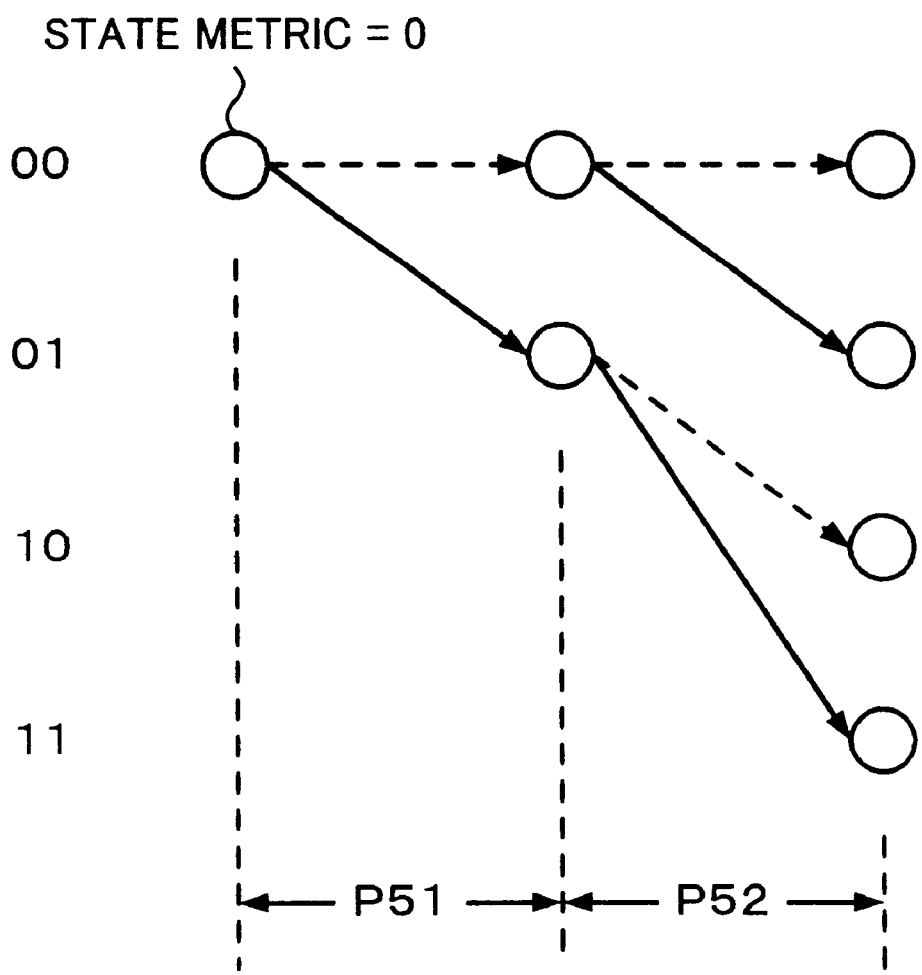
FIG. 17 is a schematic diagram for explaining a metric for a path from state 00.

Therefore, the state metric of state 00 is initialized to 0 and the state metrics of the other states are initialized to 31. Since the branch metric for one clock consists of four bits, as shown in FIG. 17, the values of the branch metrics in periods P51 and P52 are equal to or less than 15 (the maximum value which is expressed by 4 bits), the number of metrics for the path in which state 00 is used as a start point is equal to or less than 30 for a period of time (namely, after the elapse of the periods P51 and P52) of two clocks after the start of the new convolution code. Thus, the path from state 00 is certainly selected.

Even if the subsequent operation is executed in a manner similar to the ordinary decoding operation and the decoding is performed while tracing back by an interval corresponding to the cut-length, as for the decoding at the timing when the termination is performed, the maximum likelihood path is certainly selected from the paths which pass state 00. Even in the fourth embodiment of the invention as mentioned above, when the terminated convolution codes are continuously inputted as well, the path which reaches the state to be terminated can be decoded while continuing the decoding operation.

In the first embodiment and the like of the invention mentioned above, although the case where the restriction length=3 and the cut-length=4 has been described, the invention can be applied to a case where the restriction length and cut-length have arbitrary values.

As mentioned above, the invention intends to perform the Viterbi decoding in consideration of the terminating interval of the reception word. Thus, the maximum likelihood decoding can be performed for the terminated convolution code.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A Viterbi decoding apparatus comprising:
   receiver means for continuously receiving a plurality of convolution codes associated with a reception data signal, each convolution code having an associated termination interval; and
   terminate state path decoding means operatively connected to said receiver means for decoding a path corresponding to a first of the convolution codes, such that upon reaching the termination interval of the first convolution code, the path of the first of the convolution codes is forced to reach a state to be terminated while simultaneously decoding another path corresponding to a next convolution code.

2. An apparatus according to claim 1, wherein said terminate state path decoding means comprises:
   a path memory operatively configured to perform a register transition method and having a register train as long as a cut-length, decoding words corresponding to the state to be terminated are stored in said register train and, upon terminating, said decoding words stored in said register train are sequentially outputted.

3. An apparatus according to claim 1, wherein said terminate state path decoding means comprises:
   a path memory to perform a register transition method including a register train as long as a predetermined cut-length, said register train having a plurality of memory cells, and
   a control circuit operatively connected to the register train to control selection information of each memory cell in said register train corresponding to the state to be terminated when performing a register transition method,
   a decoding word corresponding to the state to be terminated is outputted as it is upon terminating by an operation of said control circuit.

4. An apparatus according to claim 1, further comprising
   a path memory operatively configured to perform a traceback method,
   and wherein by setting a cut-length so as to be m/n (m and n are integers) of a termination length,
   a tracing is started from the state to be terminated upon terminating.

5. An apparatus according to claim 1, further comprising a state metric storing circuit operatively connected to the terminate state path decoding means, the terminate state path decoding means operatively configured to cause said state metric storing circuit to set a state metric of a state other than the state to be terminated to be a large enough value upon terminating, such that a path which passes through the state to be terminated is decoded with substantial certainty.

6. A Viterbi decoding method for continuously processing a plurality of convolution codes associated with a reception data signal, each convolution code having an associated termination interval, the method comprising the steps of:
   decoding a path corresponding to a first of the convolution codes, such that upon reaching the termination interval of the first convolution code, the path of the first of the convolution codes is forced to reach a state to be terminated while simultaneously decoding another path corresponding to a next convolution code.

7. A method according to claim 6, wherein when decoding by a register transition method, said Viterbi decoding method further comprises the steps of:
   storing decoding words corresponding to the state to be terminated into a register train as long as a cut-length added to a path memory to perform the register transition method; and
   sequentially outputting said decoding words stored in said register train upon terminating.

8. A method according to claim 6, wherein when decoding by a register transition method, said Viterbi decoding method further comprises the steps of:
   controlling selection information of each memory cell in a register train corresponding to the state to be terminated; and outputting decoding words corresponding to the state to be terminated as they are upon terminating when the selection information is a predetermined value.

9. A method according to claim 6, wherein when decoding by a trace-back method, said Viterbi decoding method further comprises the steps of: setting a cut-length so as to be equal to m/n (m and n are integers) of a termination length; and starting a tracing from the state to be terminated upon terminating.

10. A method according to claim 6, further comprising the steps of:

setting each state metric of the states other than the state to be terminated to a large enough value upon terminating; and decoding a path which passes through the state to be terminated.

11. A Viterbi decoding apparatus comprising:

a terminate state path decoding means for decoding a path which reaches a state to be terminated corresponding to a first of a plurality of convolution codes, wherein said terminate state path decoding means further comprises:

a path memory operatively configured to perform a register transition method and having a plurality of register trains, each register train as long as a cut-length, wherein decoding words corresponding to the state to be terminated are stored in a first of said register trains and, upon terminating, said decoding words stored in said first register train are sequentially outputted while a second of the plurality of convolution codes is decoded using the same plurality of register trains of said path memory.

12. A Viterbi decoding apparatus comprising:

a terminate state path decoding means for decoding a path which reaches a state to be terminated corresponding to a first of a plurality of convolution codes, wherein said terminate state path decoding means further comprises:

a path memory to perform a register transition method, said path memory including a plurality of register trains as long as a cut-length, a first of said register trains having a plurality of memory cells, and a control circuit operatively connected to the first register train to control selection information of each memory cell in said first register train corresponding to the state to be terminated when performing a register transition method, a decoding word corresponding to the state to be terminated is outputted as it is upon terminating by an operation of said control circuit while a second of the plurality of convolution codes is simultaneously decoded using the same plurality of register trains of said path memory.

13. A Viterbi decoding apparatus comprising:

a terminate state path decoding means for decoding a path corresponding to a first of a plurality of convolution codes, each of the convolution codes having a termination interval, and for forcing the path of the first convolution code to reach a state to be terminated when the termination interval of the first convolution code is detected, wherein said terminate state path decoding means further comprises:

a path memory operatively configured to perform a trace-back method, and wherein by setting a cut-length so as to be a fraction m/n (m and n are integers) of a termination length, a tracing is started from the state to be terminated upon terminating.

14. A Viterbi decoding method for continuously processing a plurality of convolution codes associated with a reception data signal, the method comprising the steps of:

decoding a path corresponding to a first of a plurality of convolution codes, each of the convolution codes having a termination interval, and for forcing the path of the first convolution code to reach a state to be terminated when the termination interval of the first convolution code is detected;

storing decoding words corresponding to the state to be terminated into a register train as long as a cut-length added to a path memory to perform the register transition method; and sequentially outputting said decoding words stored in said register train upon terminating.

15. A Viterbi decoding method for continuously processing a plurality of convolution codes associated with a reception data signal, the method comprising the steps of:

decoding a path corresponding to a first of a plurality of convolution codes, each of the convolution codes having a termination interval, and for forcing the path of the first convolution code to reach a state to be terminated when the termination interval of the first convolution code is detected;

controlling selection information of each memory cell in a register train corresponding to the state to be terminated; and outputting decoding words corresponding to the state to be terminated as they are upon terminating by the operation of said control step.

16. A Viterbi decoding method for continuously processing a plurality of convolution codes associated with a reception data signal, the method comprising the steps of:

decoding a path corresponding to a first of a plurality of convolution codes, each of the convolution codes having a termination interval, and for forcing the path of the first convolution code to reach a state to be terminated when the termination interval of the first convolution code is detected;

setting a cut-length so as to be equal to a fraction m/n (m and n are integers) of a termination length; and starting a tracing from the state to be terminated upon terminating.

17. A Viterbi decoding method for continuously processing a plurality of convolution codes associated with a reception data signal, the method comprising the steps of:

decoding a path corresponding to a first of a plurality of convolution codes, each of the convolution codes having a termination interval, and for forcing the path of the first convolution code to reach a state to be terminated when the termination interval of the first convolution code is detected;

setting a state metric of the states other than the state to be terminated to a large enough value upon terminating; and decoding a path which passes through the state to be terminated.

* * * * *